United States Patent
Al et al.

(10) Patent No.: US 9,656,292 B2
(45) Date of Patent: May 23, 2017

(54) COATING METHOD, COATING DEVICE AND COATING GENERATING SYSTEM

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Qingnan Al, Beijing (CN); Mengxiao Pan, Beijing (CN); He Zhou, Beijing (CN); Yue Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/499,641

(22) Filed: Sep. 29, 2014

(65) Prior Publication Data
US 2015/0238999 A1 Aug. 27, 2015

(30) Foreign Application Priority Data
Feb. 24, 2014 (CN) .......................... 2014 1 0062173

(51) Int. Cl.
| | |
|---|---|
| *B05C 9/08* | (2006.01) |
| *B05D 1/00* | (2006.01) |
| *C23C 16/44* | (2006.01) |
| *C23C 16/52* | (2006.01) |
| *G02F 1/13* | (2006.01) |

(52) U.S. Cl.
CPC ............ *B05D 1/00* (2013.01); *C23C 16/4405* (2013.01); *C23C 16/52* (2013.01); *G02F 1/1303* (2013.01); *G02F 2001/1316* (2013.01)

(58) Field of Classification Search
None
See application file for complete search history.

(56) References Cited

U.S. PATENT DOCUMENTS

| | | | |
|---|---|---|---|
| 5,138,520 A * | 8/1992 | McMillan | ........... C23C 16/4412 257/E21.01 |
| 2004/0253824 A1 | 12/2004 | Tegeder | |
| 2005/0235917 A1 * | 10/2005 | Fordemwalt | ........ C23C 16/4407 118/723 R |

FOREIGN PATENT DOCUMENTS

| | | |
|---|---|---|
| CN | 1656600 A | 8/2005 |
| CN | 1958878 A | 5/2007 |
| CN | 102778202 A | 11/2012 |

OTHER PUBLICATIONS

Chinese Office Action dated Jul. 28, 2015 issued in corresponding Chinese Application No. 201410062173.6 along with English translation.

* cited by examiner

*Primary Examiner* — Dah-Wei D Yuan
*Assistant Examiner* — Jethro M Pence
(74) *Attorney, Agent, or Firm* — Nath Goldberg Meyer; Joshua B. Goldberg

(57) ABSTRACT

The invention discloses a coating method, a coating device and a coating system. The coating method comprises: collecting a thickness data of a film on inner walls of a coating chamber; and processing the thickness data to obtain the thickness of the film on the inner walls of the coating chamber. With the coating method, the cleaning for the coating device gets smarter, the troublesome of artificially controlling the cleaning in the prior art is eliminated and thus the cleaning efficiency for the coating device is improved.

19 Claims, 3 Drawing Sheets

COATING METHOD, COATING DEVICE AND COATING GENERATING SYSTEM

FIELD OF THE INVENTION

The invention relates to the field of display technology, in particular, to a coating method, a coating device and a coating system.

BACKGROUND OF THE INVENTION

During fabricating of a thin film transistor liquid crystal display (TFT-LCD), a chemical vapor deposition (CVD) is one of main processes for forming TFTs on a substrate to be coated, which is the so-called coating. Coating is a process for generating solid semiconductor with reaction gas by using a high frequency voltage in a high temperature and vacuum environment in a coating device, so that the solid semiconductor is deposited on the substrate to be coated and thus a film is deposited on the substrate.

As shown in FIG. 1, the coating process is performed in a coating chamber 1 of the coating device. Normally, a substrate 2 to be coated is placed on a stage 3 in the coating chamber 1, then reaction gas is filled into the coating chamber through a entrance 11 of the coating chamber and solid semiconductor is generated by the reaction gas in the coating chamber 1, the solid semiconductor is deposited on the substrate 2 to be coated so that a film is deposited on the substrate 2. The coating chamber 1 is further provided with a gas diffuser 8 therein, the gas diffuser 8 is mainly used to allow the reaction gas to diffuse uniformly in the coating chamber 1, so that the film deposited on the substrate 2 to be coated has a uniform thickness.

When the coating device performs coating, not only a film with a certain thickness is deposited on the substrate 2 to be coated but also a film with the same thickness will be deposited on the gas diffuser 8 and inner walls of the coating chamber 1. When the thickness of the film deposited on the gas diffuser 8 and inner walls of the coating chamber 1 is so large that the film on the gas diffuser 8 and inner walls of the coating chamber 1 may fall off due to the gravity and the pressure inside the coating chamber 1, the fallen film may generate a large quantities of particles, which may seriously affect the coating quality for the substrate 2 to be coated, therefore, the film deposited on the gas diffuser 8 and inner walls of the coating chamber 1 must be cleaned regularly. The deposited film is cleaned usually as follows: causing the gas of nitrogen trifluoride to react by an ion generating device to generate fluoride ions; filling the fluorine ions into the coating chamber 1 so that they react with the deposited film to generate gas such as fluorine gas, nitrogen gas and the like, and then discharging the gas through a pipe.

The cleaning for the coating chamber of the coating device may be performed in a certain cleaning period, the cleaning period is set according to the limit thickness of the film deposited on the inner walls of the coating chamber without falling off, that is to say, cleaning is not performed until the thickness of the film deposited on the inner walls of the coating chamber approximates to the limit thickness without falling off. Currently, the cleaning period is set as follows: first, according to the limit thickness without falling off and the thickness of a film to be deposited on each substrate to be coated, calculating the number of the substrates to be coated, wherein a sum of the thicknesses of the films to be deposited on the substrates approximates to the limit thickness without falling off, and then a total time required to coat these substrates is set as the cleaning period of the coating device. Regarding the set of the cleaning period, first, according to the thickness of a film to be coated on each of the substrates, artificially calculating the number of the substrates to be coated, on which films with a same thickness or different thicknesses are coated respectively, wherein a total thickness of the films coated on these substrates approximates to the limit thickness without falling off, and then artificially and manually setting the total number of the substrates to be coated, so that the cleaning period is set.

However, with the improvement and development of the coating process, and during the coating process of semiconductor, different substrates to be coated usually correspond to films with different thicknesses to be deposited, so the cleaning period needs to be adjusted to adapt to different products, but it is trouble to adjust the cleaning period manually. Furthermore, in a case of various types of substrates to be coated being coated, it is likely to occur that the type of the product and a preset cleaning period do not match with each other, which may cause the following undesirable results: one is that the cleaning period is short, which results in that the deposited film is cleaned up when the thickness of the film deposited on the inner walls of the coating chamber is much less than the limit thickness without falling off, thus greatly wasting the cleaning gas; another one is that the cleaning period is long, which results in that the thickness of the film deposited on the inner walls of the coating chamber is much larger than the limit thickness without falling off, that is, the cleaning for deposited film is performed after the film deposited on the inner walls of the coating chamber has begun to fall off, resulting in that there are so much particles in the coating chamber during coating, which makes the coated substrate have so much particles thereon, which directly affects the product yield.

SUMMARY OF THE INVENTION

With respect to above problems in the prior art, this invention provides a coating method, a coating device and a coating system, which collect a thickness data of a film coated on the inner walls of the coating chamber and process the thickness data to obtain a thickness of the film coated on the inner walls of the coating chamber, so that the cleaning for the coating device gets smarter, troublesome of artificially controlling the cleaning in the prior art is eliminated and thus the cleaning efficiency for the coating device is increased.

The invention provides a coating method comprising a step of coating a substrate placed on a stage within a coating chamber. The coating method further comprises steps: collecting a thickness data of a film coated on inner walls of the coating chamber; and processing the thickness data to obtain a thickness of the film coated on the inner walls of the coating chamber.

Preferably, the inner walls of the coating chamber surrounding the stage are provided with a blocking plate, and a sampling block is placed on an upper surface of the blocking plate, and wherein the step of collecting the thickness data of a film coated on the inner walls of the coating chamber comprises a step of collecting the thickness data of a film coated on the sampling block by using a light reflection method as the thickness data of the film coated on the inner walls of the coating chamber, and which specifically comprises steps of: irradiating light onto the sampling block; collecting light reflected from the sampling block; performing spectroscopy on the reflected light to acquire a reflection spectrum; and converting the reflection spectrum into an analog electric signal.

Preferably, the step of processing the thickness data to obtain a thickness of the film coated on the inner walls of the coating chamber comprises steps of: converting the analog electric signal into a digital electric signal; and calculating the thickness of the film from the digital electric signal.

The invention further provides a coating device for coating a substrate to be coated, which comprises a coating chamber, and a stage for carrying the substrate to be coated is provided at the bottom of the coating chamber, wherein the coating device further comprises a measuring mechanism comprising a measuring unit and a processing unit, the measuring unit is communicated with the coating chamber for collecting the thickness data of a film coated on the inner walls of the coating chamber and transmitting the thickness data to the processing unit, and the processing unit is used to process the thickness data to obtain a thickness of the film coated on the inner walls of the coating chamber.

Preferably, the inner walls of the coating chamber surrounding the stage are provided with a blocking plate, a sampling block is placed on an upper surface of the blocking plate, the measuring unit comprises a light source, a spectroscopic element and a light-collecting module, and wherein the spectroscopic element is disposed to be opposite to the sampling block, the light emitted from the light source irradiates onto the sampling block through the spectroscopic element; the spectroscopic element is configured to perform spectroscopy on the light reflected from the sampling block to acquire a reflection spectrum; the light-collecting module is configured to collect the reflection spectrum and converting the reflection spectrum into an analog electric signal; and the processing unit is configured to process the analog electric signal to obtain the thickness of the film.

Preferably, the sampling block is made of transparent glass.

Preferably, the spectroscopic element and the light-collecting module are connected and integrated together, and the spectroscopic element penetrates through one of the walls of the coating chamber and a free end of the spectroscopic element extends into the coating chamber, a light-outputting surface of the spectroscopic element is disposed at the tip of the free end so that the light-outputting surface is parallel to and opposite to the upper surface of the sampling block, and the spectroscopic element and the wall that the spectroscopic element penetrates through are sealingly engaged.

Preferably, the processing unit comprises a A/D converting module and a calculating module, and wherein the A/D converting module is connected to the light-collecting module and the calculating module respectively for converting the analog electric signal into a digital electric signal, and the calculating module is configured to calculate the thickness of the film from the digital electric signal.

Preferably, the coating device further comprises a control module and a cleaning mechanism both of which are electrically connected to the calculating module, wherein the cleaning mechanism is provided at an entrance of the coating chamber, and the control module controls on and off of the cleaning mechanism according to the thickness of the film calculated by the calculating module.

Preferably, a reference value of the thickness of the film coated on the inner walls of the coating chamber and a limit value of the thickness of the film coated on the inner walls of the coating chamber are preset in the calculating module, and when a value of the thickness of the film calculated by the calculating module equals to or is larger than the reference value of the thickness of the film, the control module controls the cleaning mechanism to operate, and wherein the reference value of the thickness of the film is smaller than the limit value of the thickness of the film.

Preferably, the measuring unit is configured to collect the thickness data of a film coated on the inner walls of the coating chamber when the coating device finishes one coating procedure and there is no substrate to be coated in the coating chamber.

Preferably, the coating device further comprises a reminder module and a detecting module which are electrically connected to the control module, wherein the detecting module is provided in the coating chamber, and the detecting module is configured to detect whether the cleaning for the inner walls of the coating chamber is completed every a certain time, and the control module is further configured to control on and off of the reminder module according to the result detected by the detecting module.

Preferably, the measuring unit further comprises a wavelength filtering element which is disposed between the light source and the spectroscopic element, and which is configured to filter the light emitted from the light source into various lights with deferent wavelengths, and the blocking plate is parallel to the top surface of the stage.

The invention further provides a coating system comprising the above coating device.

Advantages of the invention are as follows: the coating method in the invention obtains a thickness of the film coated on the inner walls of the coating chamber by collecting the thickness data of a film coated on the inner walls of the coating chamber and processing the thickness data, and the coating device in the invention obtains a thickness of the film coated on the inner walls of the coating chamber by providing a measuring mechanism, collecting the thickness data of a film coated on the inner walls of the coating chamber by a measuring unit, and processing the thickness data through the processing unit, so that the cleaning for the coating device gets smarter, the troublesome of artificially setting the cleaning period according to the number of the substrates to be coated in the prior art is eliminated and thus the cleaning efficiency for the coating device is improved. On the other hand, due to the provision of the measuring mechanism, the thickness of the film coated on the inner walls of the coating chamber will be not larger than the limit thickness without falling off and not much less than the limit thickness without falling off, therefore, it is ensured that the film coated on the inner walls of the coating chamber will be cleaned up before it falls off, the affect of a large number of particles generated by the fallen film on the quality of the film coated on the substrate is eliminated, thus the product yield may be improved, and the waste of the cleaning gas is avoided and the cleaning cost is reduced.

Since the coating system in the invention adopts the above coating device, the cleaning for the coating system gets smarter, and thus the efficiencies of cleaning and operating of the coating system are greatly improved.

DETAILED DESCRIPTION OF THE EMBODIMENTS

In order to make the person skilled in the art to understand the solutions of the invention better, hereinafter, the coating method, the coating device and the coating system in the invention will be further described in detail in conjunction with the accompany drawings and embodiments.

The First Embodiment

Figure 1:
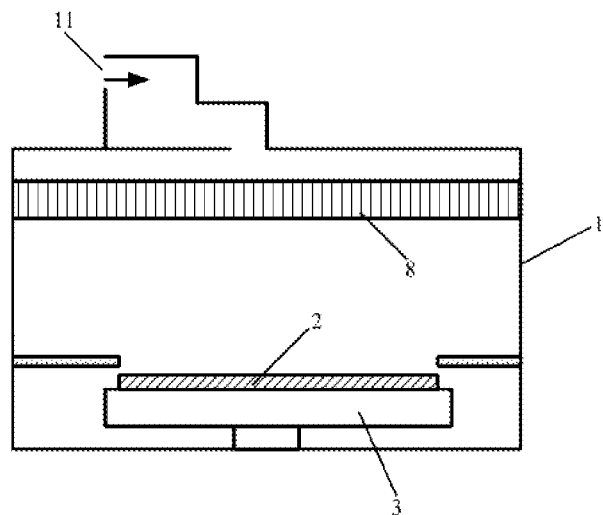
FIG. 1 is a cross sectional view of a coating device in the prior art.
Figure 2:
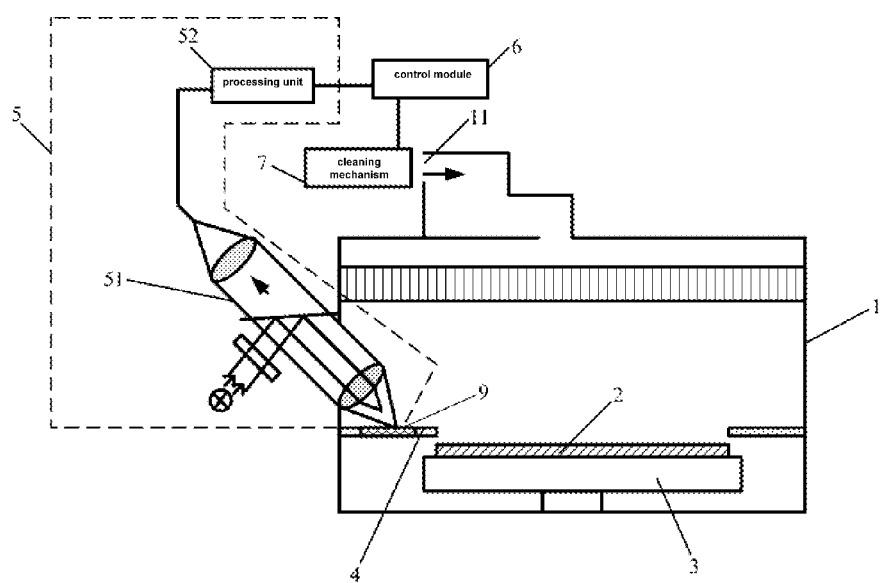
FIG. 2 is a structural diagram of a coating device in the first embodiment of the invention.

The present embodiment provides a coating device for coating a substrate to be coated, as shown in FIG. 2, the coating device comprises a coating chamber 1, and a stage 3 for carrying the substrate 2 to be coated is provided at the bottom of the coating chamber 1, wherein the coating device 1 further comprises a measuring mechanism 5 for measuring the thickness of a film, which comprises a measuring unit 51 and a processing unit 52, the measuring unit 51 is communicated with the coating chamber 1 for collecting the thickness data of a film coated on the inner walls of the coating chamber 1 and transmitting the thickness data to the processing unit 52, and the processing unit 52 processes the thickness data to obtain a thickness of the film coated on the inner walls of the coating chamber 1.

The coating device obtains a thickness of the film coated on the inner walls of the coating chamber 1 by providing the measuring mechanism 5, collecting the thickness data of the film coated on the inner walls of the coating chamber through the measuring unit 51, and processing the thickness data by the processing unit 52, and determines a time at which the coating chamber is to be cleaned according to the thickness of the film, so that the cleaning for the coating device gets smarter, the troublesome of artificially setting the number of substrates to be coated so as to determine the cleaning period in the prior art is eliminated and thus the cleaning efficiency for the coating device is increased.

Figure 3:
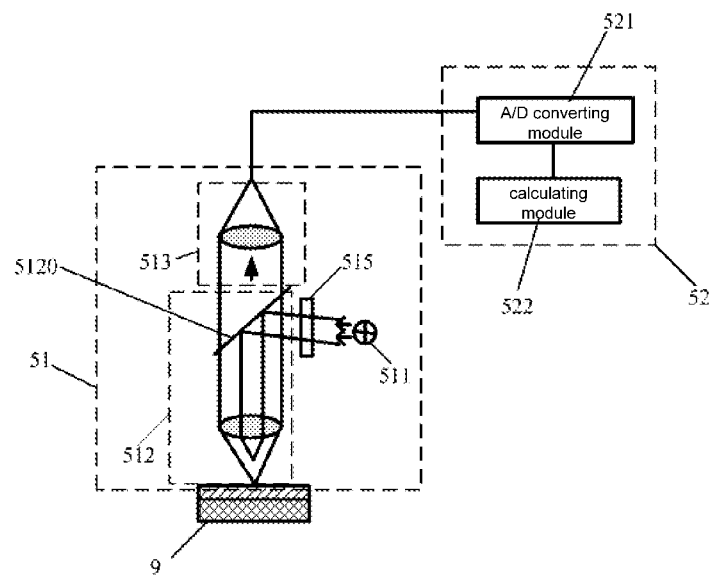
FIG. 3 is a structural diagram of a measuring mechanism in FIG. 2.

In the embodiment, as shown in FIGS. 2 and 3, the inner walls of the coating chamber 1 surrounding the stage 3 are provided with a blocking plate 4, and a sampling block 9 is placed on an upper surface of the blocking plate 4. The measuring unit 51 comprises a light source 511, a spectroscopic element 512 and a light-collecting module 513, and wherein the spectroscopic element 512 is disposed to be opposite to the sampling block 9, the light emitted from the light source 511 irradiates onto the sampling block 9 through the spectroscopic element 512; the spectroscopic element 512 is configured to perform spectroscopy on the light reflected from the sampling block 9 to acquire a reflection spectrum; the light-collecting module 513 is configured to collect the reflection spectrum and converting the reflection spectrum into an analog electric signal; and the processing unit 52 is configured to process the analog electric signal to obtain the thickness of the film.

The spectroscopic element 512 and the light-collecting module 513 are connected and integrated together, the spectroscopic element 512 penetrates through one of the side walls of the coating chamber 1 and a free end of the spectroscopic element 512 extends into the coating chamber 1, a light-outputting surface of the spectroscopic element 512 is disposed at the tip of the free end thereof so that the light-outputting surface is parallel to and opposite to the upper surface of the sampling block 9, and the spectroscopic element 512 and the side wall that the spectroscopic element 512 penetrates through are sealingly engaged. FIG. 2 shows the structure wherein the spectroscopic element 512 penetrates through one of the side walls of the coating chamber 1, which is not limited by the present embodiment. The spectroscopic element 512 may penetrate through another side wall of the coating chamber 1, as long as the light transmitting through the light-outputting surface of the spectroscopic element 512 can irradiate onto the sampling block 9.

The light-collecting module 513 adopts a charge-coupled device (CCD). It should be noted that the light-outputting surface of the spectroscopic element 512 is disposed to be parallel to and opposite to the upper surface of the sampling block 9, so that the light-outputting surface of the spectroscopic element 512 will not be coated with a film when the coating device performs coating, and thus normal operation of the spectroscopic element 512 can be ensured.

In the embodiment, the processing unit 52 comprises an analog/digital (A/D) converting module 521 and a calculating module 522, and wherein the A/D converting module 521 is connected to the light-collecting module 513 and the calculating module 522 respectively for converting the analog electric signal into a digital electric signal, and the calculating module 522 is configured to calculate the thickness of the film from the digital electric signal.

As shown in FIGS. 2 and 3, the coating device further comprises a control module 6 and a cleaning mechanism 7 which are electrically connected to the calculating module 522, wherein the cleaning mechanism 7 is provided at an entrance 11 of the coating chamber 1, and the control module 6 controls on and off of the cleaning mechanism 7 according to the thickness of the film calculated by the calculating module 522. Therefore, it is unnecessary to artificially control the cleaning for the coating device, the troublesome of the artificial control is eliminated and thus the cleaning for the coating device gets smarter.

In the embodiment, a reference value and a limit value of the thickness of the film on the inner walls of the coating chamber 1 are preset in the calculating module 522, and when a value of the thickness of the film calculated by the calculating module 522 equals to or is larger than the reference value of the thickness of the film, a signal is transmitted to the control module 6, then the control module 6 controls the cleaning mechanism 7 to start operating so that an automatic cleaning for the coating device is performed, wherein the reference value of the thickness of the film is smaller than the limit value of the thickness of the film. The limit value of the thickness refers to a limit value of the thickness of the film on the inner walls of the coating chamber 1 before the film begins to fall off, that is, when the thickness of the film on the inner walls of the coating chamber 1 reaches the limit value, the film may fall off due to the gravity and the pressure inside the coating chamber 1. The reference value of the thickness is set so that the thickness of the film on the inner walls of the coating chamber 1 will be not larger than the limit value of the thickness of the film, that is, when the thickness of the film is larger than the reference value of the thickness and the thickness of the film is less than the limit value of the thickness of the film, it can ensure that the film coated on the inner walls of the coating chamber 1 will be cleaned up before it falls off, which eliminates the affect of a large number of particles generated by the fallen film on the quality of the film coated on the substrate to be coated, thus the product yield may be improved.

In addition, it should be noted that, a difference between the reference value and the limit value of the thickness is not too much, so that when the thickness of the film is much less than the limit value of the thickness, the cleaning mechanism 7 will not be turned on to clean the inner walls of the coating chamber 1, therefore, the waste of the cleaning gas is avoided and thus the cleaning cost is reduced.

In the embodiment, the measuring unit 51 is configured to collect the thickness data of the film on the inner walls of the coating chamber 1 when the coating device finishes one coating procedure and there is no substrate to be coated in the coating chamber 1. The coating device finishing one coating procedure refers to that the coating device finishes coating a substrate 2 to be coated, that is, the measuring mechanism 5 collects the thickness data of the film whenever one substrate 2 to be coated is coated, so that when the thickness of the film on the inner walls of the coating chamber 1 equals to or is larger than the reference value of the thickness, the thickness of the film is not much less than the limit value of the thickness of the film or not larger than the limit value of the thickness, thus a cleaning period can be properly set for the coating device, which will not affect the quality of the film on the substrate to be coated, and will not seriously waste the cleaning gas.

The thickness data of the film is collected when there is no substrate 2 to be coated in the coating chamber 1, that is to say, when the coated substrate 2 is removed, the thickness data of the film on the inner walls of the coating chamber 1 is collected and subsequent processes are performed, so that it can be ensured that there is no substrate 2 to be coated in the coating chamber 1 when the cleaning mechanism 7 begins to clean the coating chamber 1, therefore, the cleaning will not affect the quality of the coated substrate 2.

In the embodiment, the coating device further comprises a reminder module and a detecting module which are electrically connected to the control module 6, wherein the detecting module is provided in the coating chamber 1, and the detecting module is configured to detect whether the cleaning for the inner walls of the coating chamber 1 is completed every a certain time, and the control module 6 is further configured to control on and off of the reminder module according to the result detected by the detecting module. Specifically, the detecting module may be a sensor provided in the coating chamber 1, the sensor detects whether the thickness of the film on the inner walls of the coating chamber 1 is 0, and if the result is positive, it is indicated that the inner walls of the coating chamber 1 has been cleaned, then the detecting module transmits a signal to the control module 6, the control module 6 controls the reminder module to be turned on, for example the reminder module may be a buzzer which will emit a buzzer sound when it is turned on for reminding that the cleaning is completed. If the result detected by the detecting module is negative, it is indicated that the inner walls of the coating chamber 1 has not been cleaned, then the control module 6 controls the cleaning mechanism 7 to continue cleaning, and at this time, the reminder module remains be turned off. The "certain time" from the start of each cleaning to a first detecting may be set as any time length between a time required for cleaning the film with its thickness being of the reference value of the thickness and a time required for cleaning the film with its thickness being of the limit value of the thickness. If the result of the first detecting is that the cleaning of the inner walls of the coating chamber 1 has not completed, the "certain time" before next detecting is set as a difference between the time required for cleaning the film with its thickness being of the limit value of the thickness and the time required for cleaning the film with its thickness being of the reference value of the thickness, so that a reminder may be made in time after the coating chamber has been cleaned, the cleaning gas may be saved, and thus the cleaning cost may be reduced.

Figure 4:
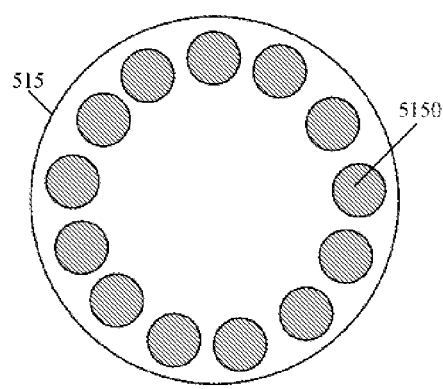
FIG. 4 is a structural diagram of a wavelength filtering wheel in FIG. 3.

In the embodiment, as shown in FIG. 3, the measuring unit 51 further comprises a wavelength filtering element 515 which is disposed between the light source 511 and the spectroscopic element 512, and which is configured to filter the light emitted from the light source 511 into various lights with deferent wavelengths. The blocking plate 4 is parallel to the top surface of the stage 3. The wavelength filtering element 515 adopts a wavelength filtering wheel, as shown in FIG. 4, after the light passing through a plurality of wavelength selecting devices 5150 provided in the wavelength filtering wheel, only a few of lights with certain wavelengths are outputted, and the outputted lights of the certain wavelengths are suitable for collecting the thickness data of the film.

Figure 5:
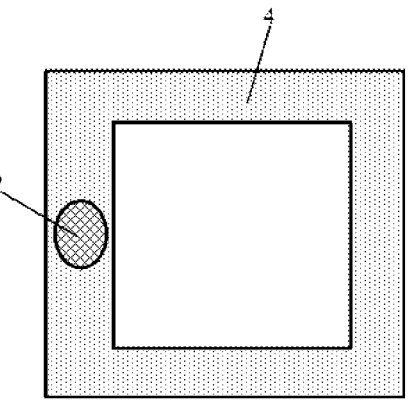
FIG. 5 is a top view of a blocking plate in FIG. 2.

In the embodiment, the light source 511 adopts a tungsten-halogen light source, and the sampling block 9 is made of transparent glass. As shown in FIG. 5, the sampling block 9 is provided on the blocking plate 4. The sampling block 9 is used as a carrier to be tested for the film coated on the inner walls of the coating chamber, and when coating is performed in the coating chamber, for every coating, the thickness of a film coated on the sampling block 9 is equivalent to that of the film coated on the substrate to be coated, and equivalent to that of the film deposited on the inner walls of the coating chamber, therefore, the thickness of the film on the sampling block 9 collected by the measuring unit may be directly used as the thickness of the film deposited on the inner walls of the coating chamber, hence, this thickness of the film on the sampling block 9 may be used as a criteria for determining whether cleaning should be performed, and it is unnecessary to measure the thickness of the film on the substrate like the prior art. Therefore, the thickness of the film on the inner walls of the coating chamber may be obtained accurately, and thus the accuracy of determining and efficiency of cleaning are improved.

The sampling block 9 made of transparent glass allows a part of light irradiated on the sampling block 9 to be reflected, and the other part of light may be boundary-reflected between the film on the sampling block 9 and the transparent glass, and boundary reflection also occurs between films. These reflected lights are interference lights emitted from the same light source, and among these interference lights, lights with different wavelengths may generate an increasing or decreasing interference in the boundary reflections between the films with different thicknesses, since the values of the reflectances of lights with different wavelengths incident on the transparent glass correspond to the thicknesses of the films coated on the transparent glass, wavelengths of the lights reflected by individual films with different thicknesses may be measured, and a reflection spectrum may be obtained according to these wavelengths. Therefore, the measurement for the thickness of the film may be more accurate by using the sampling block 9 made of transparent glass.

The measuring mechanism 5 in the embodiment may operates as follows: a light emitted from the light source 511 enters into the spectroscopic element 512 through the wavelength filtering element 515, the lights passed through the wavelength filtering element 515 are filtered into lights with different wavelengths; the lights from the wavelength filtering element 515 radiate onto the sampling block 9 (i.e., the film on the transparent glass) through the spectroscopic element 512; the lights reflected by the upper surface of the sampling block 9 are collected by a reflecting-type fiber probe 5120 provided in the spectroscopic element 512; a grating in the reflecting-type fiber probe 5120 decomposes these reflected lights to obtain a reflection spectrum; a light-collecting module 513 (for example, a charge coupled device (CCD)) collects the reflection spectrum, and converts the reflection spectrum into an analog electric signal; the A/D converter 521 in the processing unit 52 converts the analog electric signal into a digital electric signal; and the calculating module 522 in the processing unit 52 calculates the thickness of the film according to the digital electric signal.

Based on the structure of the above coating device, the invention further provides a coating method for coating a substrate to be coated provided on a stage in a coating chamber, the method comprises: collecting thickness data of a film coated on inner walls of the coating chamber; and processing the thickness data to obtain a thickness of the film coated on the inner walls of the coating chamber.

The inner walls of the coating chamber surrounding the stage are provided with a blocking plate, and a sampling block is placed on an upper surface of the blocking plate, and wherein the step of collecting the thickness data of a film coated on the inner walls of the coating chamber comprises a step of collecting the thickness data of a film coated on the sampling block by using a light reflection method as the thickness data of the film coated on the inner walls of the coating chamber, and which specifically comprises the steps of: irradiating light onto the sampling block; collecting light reflected from the sampling block; performing spectroscopy on the reflected light to acquire a reflection spectrum; and converting the reflection spectrum into an analog electric signal.

The step of processing the thickness data to obtain a thickness of the film coated on the inner walls of the coating chamber comprises the steps of: converting the analog electric signal into a digital electric signal; and calculating the thickness of the film from the digital electric signal.

The coating method obtains the thickness of the film coated on the inner walls of the coating chamber by collecting the thickness data of a film coated on the inner walls of the coating chamber and processing the thickness data, so that the cleaning for the coating device gets smarter, the troublesome of artificially setting the cleaning period according to the number of the substrates to be coated in the prior art is eliminated and thus the cleaning efficiency for the coating device is improved.

Figure 6:
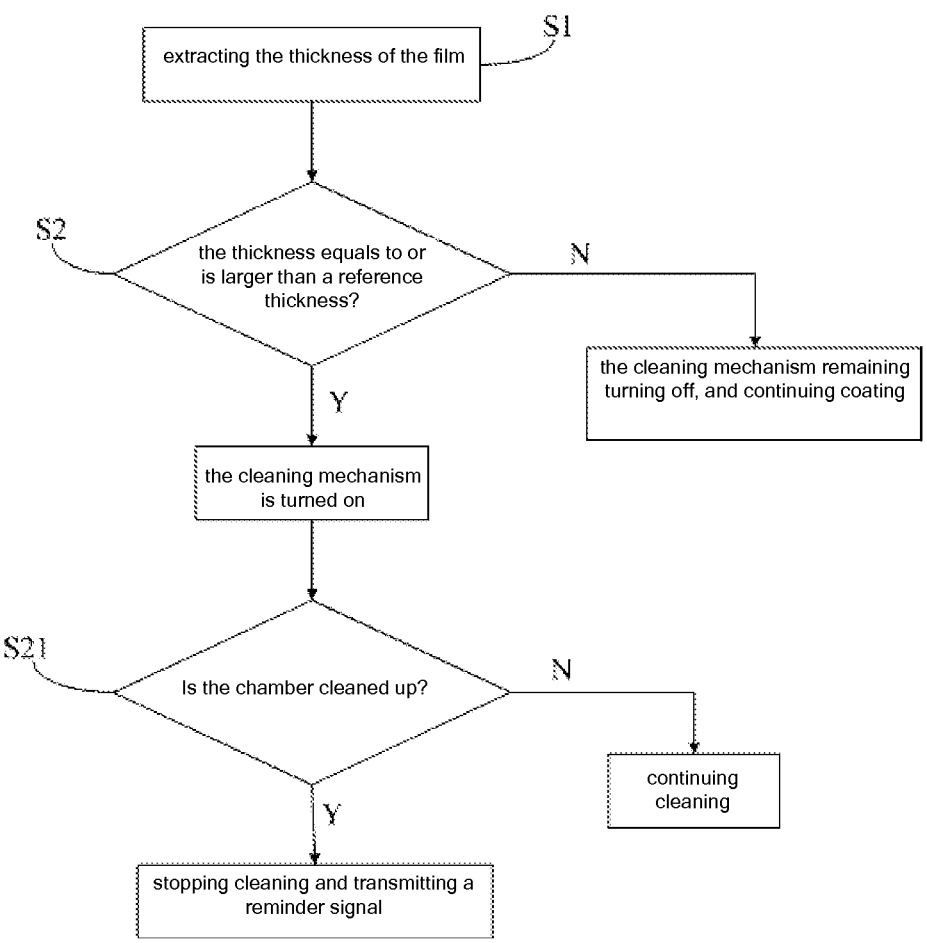
FIG. 6 is a flowchart of cleaning a coating chamber of the coating device in the first embodiment.

In the embodiment, as shown in FIG. 6, the main procedure for cleaning the inner walls of the coating chamber is as follows.

Step S1: the measuring mechanism extracts the thickness of the film.

Step S2: the control module determines whether the thickness of the film equals to or is larger than the reference value of the thickness of the film, if the determination result is positive, the cleaning mechanism is turned on, otherwise, the cleaning mechanism remains be turned off and the coating is continued.

In this step, the measuring mechanism extracts the thickness of the film whenever one substrate 2 is coated by the coating device.

The step S2 further comprises a sub-step S21: the detecting module detects whether the cleaning for the inner walls of the coating chamber is completed, if the detected result is positive, the cleaning is stopped and a reminder signal is transmitted, otherwise, the cleaning is continued.

With the above control procedure for the coating device, the troublesome of artificially setting the total number of the substrates to be coated is eliminated and thus the cleaning for the coating device gets smarter.

The Second Embodiment

The embodiment provides a coating device, unlike the coating device in the first embodiment, the coating device in this embodiment is not provided with the detecting module and the reminder module. Other structures of the coating device and the coating method are the same as those in the first embodiment, and the description thereof will be omitted.

In the present embodiment, no detecting module and reminder module are provided, that is, the cleaning for the coating device will be deemed to have been completed after a certain time in default. At this time, the cleaning mechanism automatically stops operating and the coating device continues coating. Here, the "certain time" may be set as a time length required for cleaning a film with the limit thickness, and since the thickness of the film at most equals to the limit thickness, therefore, in such a time length, the inner walls of the coating chamber usually have been cleaned.

Advantages of the first and second embodiments are as follows: the coating devices in the first and second embodiments obtain the thickness of the film coated on the inner walls of the coating chamber by providing a measuring mechanism, collecting the thickness data of a film coated on the inner walls of the coating chamber by a measuring unit, and processing the thickness data through the processing unit, and the coating methods in first and second embodiments obtain the thickness of the film coated on the inner walls of the coating chamber by collecting the thickness data of the film coated on the inner walls of the coating chamber and processing the thickness data, so that the cleaning for the coating device gets smarter, the troublesome of artificially setting the cleaning period according to the number of the substrates to be coated in the prior art is eliminated and thus the cleaning efficiency for the coating device is improved. On the other hand, due to the provision of the measuring mechanism, the thickness of the film coated on the inner walls of the coating chamber will be not larger than the limit thickness without falling off and not much less than the limit thickness, therefore, it is ensured that the film coated on the inner walls of the coating chamber will be cleaned up before it falls off, eliminating the affect of a large number of particles generated by the fallen film on the quality of the film coated on the substrate, thus the product yield may be improved, and the waste of the cleaning gas is avoided and the cleaning cost is reduced.

The Third Embodiment

The embodiment provides a coating system comprising the coating device in any one of the first and second embodiments.

Since the coating system adopts the above coating device in any one of the first and second embodiments, the cleaning for the coating system gets smarter, and thus the efficiency of cleaning and operating of the coating system are greatly improved.

It should be understood that above embodiments are just examples for illustrating the principle of the invention, however, the invention is not limited thereto. Various modifications and variations can be made by a person skilled in the art without departing from the spirit and the scope of the present invention. These modifications and variations should be considered to be within protection scope of the present invention.

The invention claimed is:

1. A coating method, which comprises a step of coating a substrate to be coated which is placed on a stage in a coating chamber, using a coating device for coating the substrate to be coated, which comprises the coating chamber, and the stage for carrying the substrate to be coated is provided at the bottom of the coating chamber, wherein the coating device further comprises a measuring mechanism comprising a measuring unit and a processing unit, the measuring unit is communicated with the coating chamber for collecting a thickness data of a film coated on the inner walls of the coating chamber and transmitting the thickness data to the processing unit, and the processing unit is used to process the thickness data to obtain a thickness of the film coated on the inner walls of the coating chamber, and wherein the thickness data is reflection spectrum, wherein the inner walls of the coating chamber surrounding the stage are provided with a blocking plate, the blocking plate surrounding the stage in an annular shape, a sampling block is placed on an upper surface of the blocking plate, the measuring unit comprises a light source, a spectroscopic element and a light-collecting module, and wherein the spectroscopic element is disposed to be opposite to the sampling block, the light emitted from the light source irradiates onto the sampling block through the spectroscopic element; the spectroscopic element is configured to perform spectroscopy on the light reflected from the sampling block to acquire a reflection spectrum; the light-collecting module is configured to collect the reflection spectrum and convert the reflection spectrum into an analog electric signal, and the processing unit is configured to process the analog electric signal to obtain the thickness of the film;

wherein the method further comprises steps of:
collecting a thickness data of a film coated on inner walls of the coating chamber; and
processing the thickness data to obtain a thickness of the film coated on the inner walls of the coating chamber.

2. The coating method of claim 1, wherein the inner walls of the coating chamber surrounding the stage are provided with a blocking plate, and a sampling block is placed on an upper surface of the blocking plate, and wherein the step of collecting the thickness data of the film coated on the inner walls of the coating chamber comprises a step of collecting the thickness data of a film coated on the sampling block by using a light reflection method as the thickness data of the film coated on the inner walls of the coating chamber, and which specifically comprises steps of: irradiating light onto the sampling block; collecting lights reflected from the sampling block; performing spectroscopy on the reflected lights to acquire a reflection spectrum; and converting the reflection spectrum into an analog electric signal.

3. The coating method of claim 2, wherein the step of processing the thickness data to obtain the thickness of the film coated on the inner walls of the coating chamber comprises steps of:
converting the analog electric signal into a digital electric signal; and
calculating the thickness of the film from the digital electric signal.

4. A coating device for coating a substrate to be coated, which comprises a coating chamber, and a stage for carrying the substrate to be coated is provided at the bottom of the coating chamber, wherein the coating device further comprises a measuring mechanism comprising a measuring unit and a processing unit, the measuring unit is communicated with the coating chamber for collecting a thickness data of a film coated on the inner walls of the coating chamber and transmitting the thickness data to the processing unit, and the processing unit is used to process the thickness data to obtain a thickness of the film coated on the inner walls of the coating chamber, wherein the thickness data is reflection spectrum, wherein the inner walls of the coating chamber surrounding the stage are provided with a blocking plate, the blocking plate surrounding the stage in an annular shape, a sampling block is placed on an upper surface of the blocking plate, the measuring unit comprises a light source, a spectroscopic element and a light-collecting module, and wherein the spectroscopic element is disposed to be opposite to the sampling block, the light emitted from the light source irradiates onto the sampling block through the spectroscopic element the spectroscopic element is configured to perform spectroscopy on the light reflected from the sampling block to acquire a reflection spectrum; the light-collecting module is configured to collect the reflection spectrum and convert the reflection spectrum into an analog electric signal, and the processing unit is configured to process the analog electric signal to obtain the thickness of the film.

5. The coating device of claim 4, wherein the sampling block is made of transparent glass.

6. The coating device of claim 5, wherein the spectroscopic element and the light-collecting module are connected and integrated together, and the spectroscopic element penetrates through one of the walls of the coating chamber and a free end of the spectroscopic element extends into the coating chamber, a light-outputting surface of the spectroscopic element is disposed at the tip of the free end so that the light-outputting surface is parallel to and opposite to the upper surface of the sampling block, and the spectroscopic element and the wall that the spectroscopic element penetrates through are sealingly engaged.

7. The coating device of claim 6, wherein the processing unit comprises a A/D converting module and a calculating module, and wherein the A/D converting module is connected to the light-collecting module and the calculating module respectively for converting the analog electric signal into a digital electric signal, and the calculating module is configured to calculate the thickness of the film from the digital electric signal.

8. The coating device of claim 7, further comprises a control module and a cleaning mechanism which are electrically connected to the calculating module, wherein the cleaning mechanism is provided at an entrance of the coating chamber, and the control module controls on and off of the cleaning mechanism according to the thickness of the film calculated by the calculating module.

9. The coating device of claim 8, wherein a reference value of the thickness of the film coated on the inner walls of the coating chamber and a limit value of the thickness of the film coated on the inner walls of the coating chamber are preset in the calculating module, and when a value of the thickness of the film calculated by the calculating module equals to or is larger than the reference value of the thickness of the film, the control module controls the cleaning mechanism to operate, and wherein the reference value of the thickness of the film is smaller than the limit value of the thickness of the film.

10. The coating device of claim 9, wherein the measuring unit is configured to collect the thickness data of the film coated on the inner walls of the coating chamber when the coating device finishes one coating procedure and there is no substrate to be coated in the coating chamber.

11. The coating device of claim 10, further comprises a reminder module and a detecting module which are electrically connected to the control module, wherein the detecting module is provided in the coating chamber, and the detecting module is configured to detect whether the cleaning for the inner walls of the coating chamber is completed every a certain time, and the control module is further configured to control on and off of the reminder module according to the result detected by the detecting module.

12. The coating device of claim 4, wherein the measuring unit further comprises a wavelength filtering element which is disposed between the light source and the spectroscopic element, and which is configured to filter the light emitted from the light source into various lights with different wavelengths, and the blocking plate is parallel to the top surface of the stage.

13. The coating device of claim 5, wherein the measuring unit further comprises a wavelength filtering element which is disposed between the light source and the spectroscopic element, and which is configured to filter the light emitted from the light source into various lights with different wavelengths, and the blocking plate is parallel to the top surface of the stage.

14. The coating device of claim 6, wherein the measuring unit further comprises a wavelength filtering element which is disposed between the light source and the spectroscopic element, and which is configured to filter the light emitted from the light source into various lights with different wavelengths, and the blocking plate is parallel to the top surface of the stage.

15. The coating device of claim 7, wherein the measuring unit further comprises a wavelength filtering element which is disposed between the light source and the spectroscopic element, and which is configured to filter the light emitted from the light source into various lights with different wavelengths, and the blocking plate is parallel to the top surface of the stage.

16. The coating device of claim 8, wherein the measuring unit further comprises a wavelength filtering element which is disposed between the light source and the spectroscopic element, and which is configured to filter the light emitted from the light source into various lights with different wavelengths, and the blocking plate is parallel to the top surface of the stage.

17. The coating device of claim 9, wherein the measuring unit further comprises a wavelength filtering element which is disposed between the light source and the spectroscopic element, and which is configured to filter the light emitted from the light source into various lights with different wavelengths, and the blocking plate is parallel to the top surface of the stage.

18. The coating device of claim 10, wherein the measuring unit further comprises a wavelength filtering element which is disposed between the light source and the spectroscopic element, and which is configured to filter the light emitted from the light source into various lights with different wavelengths, and the blocking plate is parallel to the top surface of the stage.

19. A coating system comprising the coating device according to claim 4.

* * * * *